(12) United States Patent
Kuraya et al.

(10) Patent No.: US 7,659,635 B2
(45) Date of Patent: Feb. 9, 2010

(54) SEMICONDUCTOR DEVICE AND METHOD OF MANUFACTURING THE SAME

(75) Inventors: Hidetoshi Kuraya, Tokyo (JP); Hideyuki Arakawa, Tokyo (JP); Fumiaki Aga, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/204,394

(22) Filed: Sep. 4, 2008

(65) Prior Publication Data

US 2009/0001572 A1  Jan. 1, 2009

Related U.S. Application Data

(62) Division of application No. 11/376,090, filed on Mar. 16, 2006, now Pat. No. 7,456,091.

(30) Foreign Application Priority Data

May 20, 2005  (JP) .............................. 2005-147674

(51) Int. Cl.
*H01L 29/40* (2006.01)
*B23K 31/00* (2006.01)
*C22C 5/02* (2006.01)

(52) U.S. Cl. ............... 257/784; 257/734; 257/E23.033; 257/E33.068; 228/180.5; 228/4.5; 420/507

(58) Field of Classification Search ................. 257/784, 257/734, E23.033, E23.068; 228/180.5, 228/4.5; 420/507

See application file for complete search history.

(56) References Cited

U.S. PATENT DOCUMENTS

| | | | |
|---|---|---|---|
| 6,492,593 | B2 | 12/2002 | Murai et al. |
| 6,854,637 | B2 * | 2/2005 | Harun et al. ............. 228/180.5 |
| 2003/0034097 | A1 * | 2/2003 | Ogasa ........................ 148/538 |

FOREIGN PATENT DOCUMENTS

| | | |
|---|---|---|
| JP | 5-82576 | 4/1993 |
| JP | 6-145842 | 5/1994 |
| JP | 10-340979 | 12/1998 |
| JP | 2000-12583 | 1/2000 |
| JP | 2000-12746 | 1/2000 |
| JP | 2001-15541 | 1/2001 |
| JP | 2002-359261 | 12/2002 |
| JP | 2002-363395 | 12/2002 |
| JP | 2003-86622 | 3/2003 |
| JP | 2004-356382 | 12/2004 |

* cited by examiner

*Primary Examiner*—Long K Tran
(74) *Attorney, Agent, or Firm*—Oblon, Spivak, McClelland, Maier & Neustadt, L.L.P.

(57) ABSTRACT

A semiconductor device of the present invention includes a chip which has a pad; a bump electrode formed on the pad; and a wire whose stitch bonding is made on the bump electrode. The wire satisfies a condition: (modulus-of-elasticity/breaking strength per unit area)≧400.

2 Claims, 11 Drawing Sheets

SEMICONDUCTOR DEVICE AND METHOD OF MANUFACTURING THE SAME

CROSS-REFERENCE TO RELATED APPLICATIONS

This is a divisional application of Ser. No. 11/376,090, filed Mar. 16, 2006, and claims priority to Japanese Patent Application No. 2005-147674 filed on May 20, 2005, both of which are incorporated herein by reference.

BACKGROUND OF THE INVENTION

1. Field of the Invention

The present invention relates to a semiconductor device having a chip which has a pad, a bump electrode formed on the pad, and a wire whose stitch bonding is performed on the bump electrode, and its manufacturing method.

2. Background Art

When performing stitch bonding of a gold wire on an aluminum pad on a chip directly, load of a capillary concentrates and a crack enters into SiO2 interlayer insulation film under the aluminum pad. For this reason, a bump electrode is used for the wire bonding between a chip and a chip (chip-to-chip) (for example, refer to Japanese Unexamined Patent Publication No. 2001-15541). Further, in a thin package, in order to make the height of a gold wire low, reverse bonding using a bump electrode is performed.

FIGS. 10A and 10B are sectional views showing the state of conventional bump electrode formation. First, as shown in FIG. 10A, bump electrode 14 is formed on aluminum pad 11 of a chip with gold wire 13 discharged from capillary 12. Then, as shown in FIG. 10B, gold wire 13 is cut by pulling upward, while holding both sides of gold wire 13 by clamper 15.

FIGS. 11A and 11B are sectional views showing the state of conventional stitch bonding of a gold wire onto a bump electrode. First, as shown in FIG. 11A, gold wire 13 is crushed by pushing and pressing gold wire 13 to bump electrode 14 and applying supersonic vibration by capillary 12, and gold wire 13 is joined to bump electrode 14. Then, as shown in FIG. 11B, gold wire 13 is cut by pulling upward, while holding both sides of gold wire 13 by clamper 15.

However, since the gold wire used as a material of bump electrode 14 is soft in the conventional formation of a bump electrode with a gold wire and conventional stitch bonding of a gold wire onto a bump electrode, crush of gold wire 13 held by capillary 12 and bump electrode 14 becomes insufficient, so that gold wire 13 cannot become sufficiently thin. Hereby, since the strength of gold wire 13 becomes high, the distortion of gold wire 13 by the reaction at the time of cutting gold wire 13, and the peeling of bump electrode 14 from aluminum pad 11 occur. The same phenomenon is generated also in the conventional bump electrode formation. As a result, there was a problem of gold wires having electrically short-circuited with S character deflection of gold wire 13 resulting from distortion, and opening electrically by peeling of bump electrode 14.

What is necessary is just to use the soft type gold wire cut by lower load, in order to solve this problem. However, since the modulus of elasticity is low, the such soft type gold wire had the problem that a gold wire flowed when sealing resin was poured, and gold wires electrically short-circuited.

SUMMARY OF THE INVENTION

The present invention was made in order to solve the above problems. A purpose is to obtain the semiconductor device and its manufacturing method which can protect electric short circuit of wires and peeling of a bump electrode, and can be stably manufactured.

A semiconductor device according to claim 1 comprises a chip which has a pad; a bump electrode formed on the pad; and a wire whose stitch bonding is made on the bump electrode; wherein the wire satisfies a condition: (modulus-of-elasticity/breaking strength per unit area)$\geq 400$.

A manufacturing method of a semiconductor device according to claim 3 comprises the steps of: forming a bump electrode on a pad with a wire passed to a capillary; operating the capillary in a horizontal direction with an amplitude at least more than a clearance between the wire, and an inner wall of the capillary after the step of forming the bump electrode; and cutting the wire by pulling upward, holding both sides of the wire by a clamper after the step of operating the capillary in a horizontal direction; wherein as the wire, what satisfies a condition: (modulus-of-elasticity/breaking strength per unit area)$\geq 400$ is used.

A manufacturing method of a semiconductor device according to claim 4 comprises the steps of: performing stitch bonding of a wire on a bump electrode using a capillary; operating the capillary in a horizontal direction with an amplitude at least more than a clearance between the wire, and an inner wall of the capillary after the step of performing stitch bonding; and cutting the wire by pulling upward, holding both sides of the wire by a clamper after the step of operating the capillary in a horizontal direction; wherein as the wire, what satisfies a condition: (modulus-of-elasticity/breaking strength per unit area)$\geq 400$ is used.

The features and advantages of the present invention may be summarized as follows.

The features and advantages of the present invention may be summarized as follows. Since a wire can be cut with a low load, maintaining the modulus of elasticity of the wire, electric short circuit of wires and peeling of a bump electrode are prevented, so that the highly integrated semiconductor device can be stably manufactured.

DETAILED DESCRIPTION OF THE PREFERRED EMBODIMENTS

First Embodiment

Figure 1A:
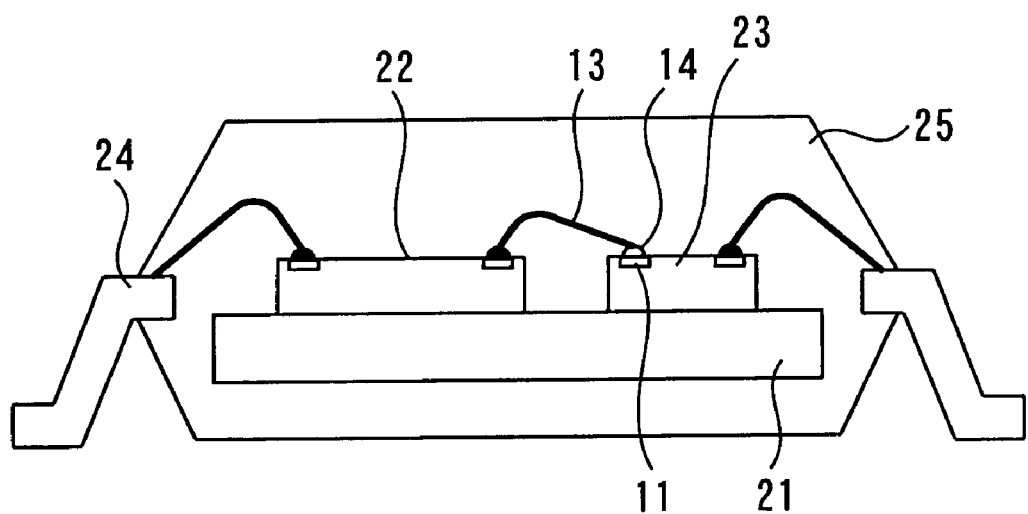
FIG. 1A is a sectional view showing an example of the semiconductor device concerning First Embodiment of the present invention.
Figure 1B:
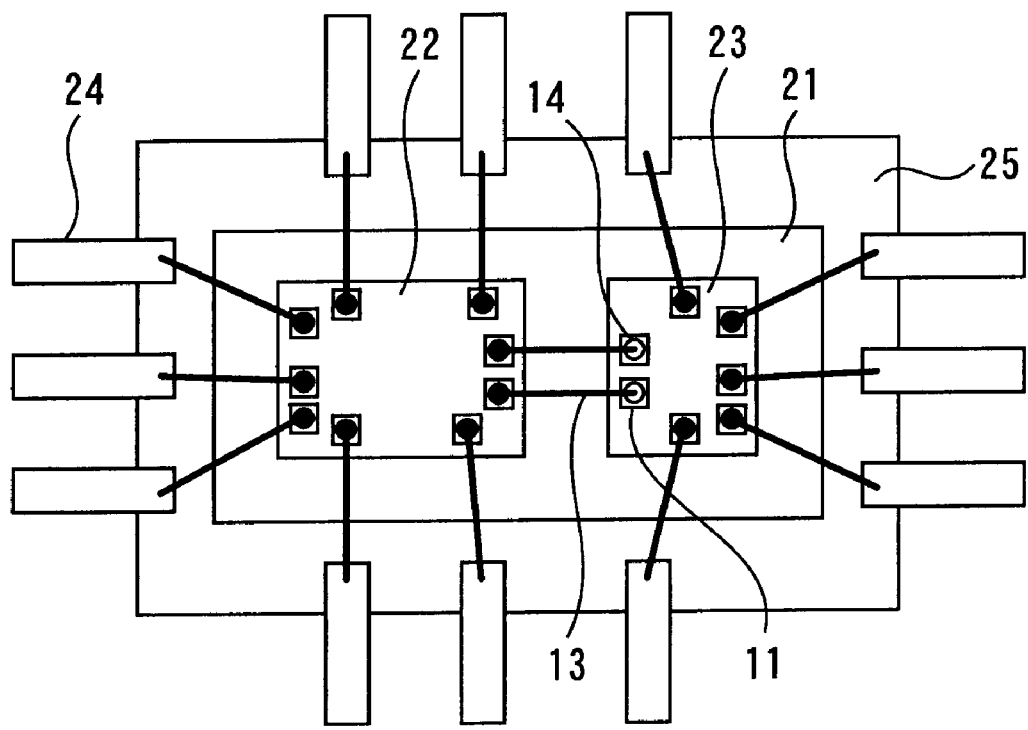
FIG. 1B is a top view showing an example of the semiconductor device concerning First Embodiment of the present invention.

FIG. 1A is a sectional view showing an example of the semiconductor device concerning First Embodiment of the present invention, and FIG. 1B is the top view. Chip 22 and chip 23 are mounted on die pad 21, being put in order. These chips 22 and 23 and lead 24 are connected by gold wire 13. Further, bump electrode 14 is formed on aluminum pad 11 of chip 23. And ball bonding of the gold wire 13 is performed on the aluminum pad of chip 22, and the stitch bonding is performed on bump electrode 14. Furthermore, the whole is sealed with sealing resin 25.

Figure 2A:
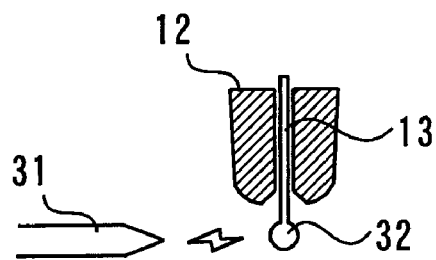
FIGS. 2A-2C are sectional views showing the step which forms a bump electrode.
Figure 2B:
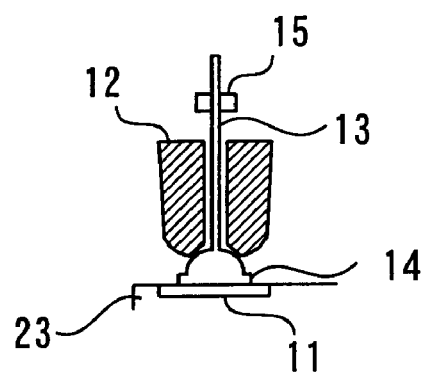
Figure 2C:
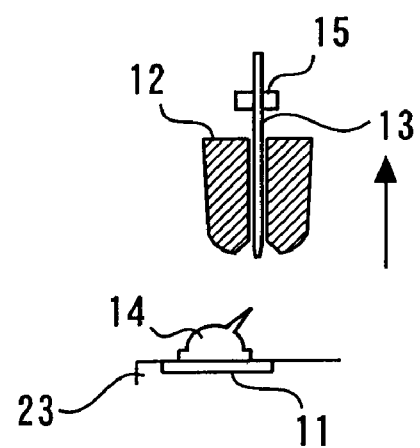

FIGS. 2A-2C are sectional views showing the step which forms a bump electrode. First, as shown in FIG. 2A, gold ball 32 with a larger diameter than gold wire 13 is formed by melting the tip of gold wire 13 discharged from capillary 12 by discharge from blowpipe 31. Then, as shown in FIG. 2B, gold ball 32 is pushed and pressed by capillary 12 on aluminum pad 11 of chip 23 arranged on a stage. And the interface of aluminum pad 11 is joined to gold ball 32 by applying load, heat, supersonic wave, etc. Then, as shown in FIG. 2C, by holding both sides of gold wire 13 above capillary 12 and pulling by clamper 15, gold wire 13 is cut above gold ball 32. Thus, bump electrode 14 is formed on aluminum pad 11 with gold wire 13 discharged from capillary 12.

Figure 3A:
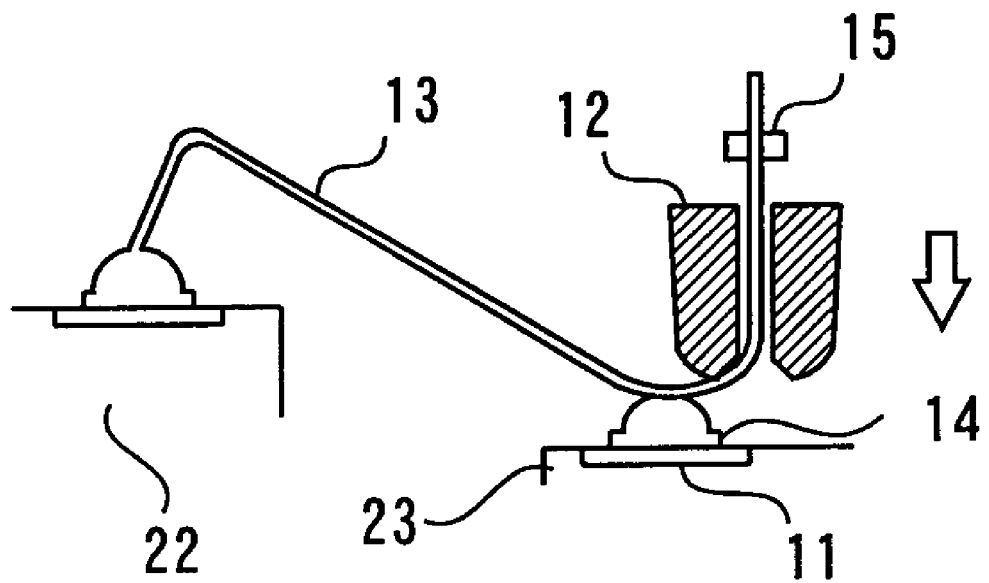
FIGS. 3A and 3B are sectional views showing the step which performs stitch bonding of a gold wire on a bump electrode.
Figure 3B:
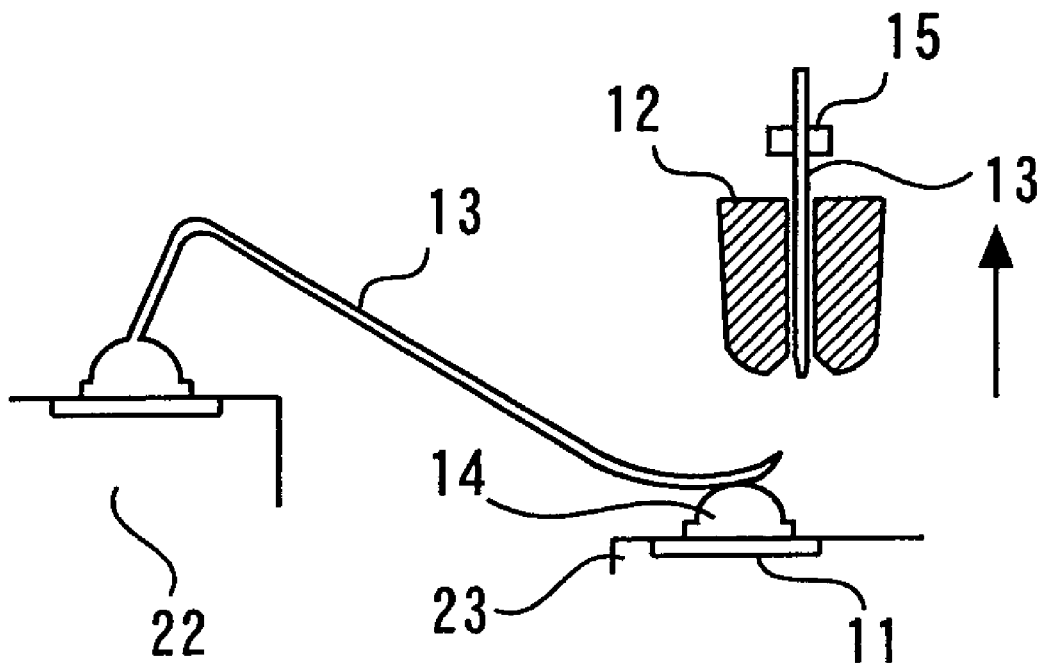

FIGS. 3A and 3B are sectional views showing the step which performs stitch bonding of a gold wire on a bump electrode. First, gold ball 32 is formed at the tip of gold wire 13 discharged from capillary 12 like FIG. 2A, and as shown in FIG. 3A, ball bonding (first bonding) of the gold ball 32 at the tip of gold wire 13 is performed on an aluminum pad of chip 22 using capillary 12. Then, gold wire 13 prolonged from gold ball 32 is discharged from capillary 12, and lengthened onto bump electrode 14. And the stitch bonding (second bonding) of a part of gold wires 13 prolonged from gold ball 32 is performed on bump electrode 14, pushing and pressing gold wire 13 for 10 ms (milli seconds) to bump electrode 14 by capillary 12, and applying supersonic vibration. And as shown in FIG. 3B, gold wire 13 is cut (tail cut) by pulling upward, holding both sides of gold wire 13 by clamper 15. Thus, gold wire 13 which electrically connects the aluminum pad of chip 22 with bump electrode 14 is formed with gold wire 13 discharged from capillary 12.

Figure 4:
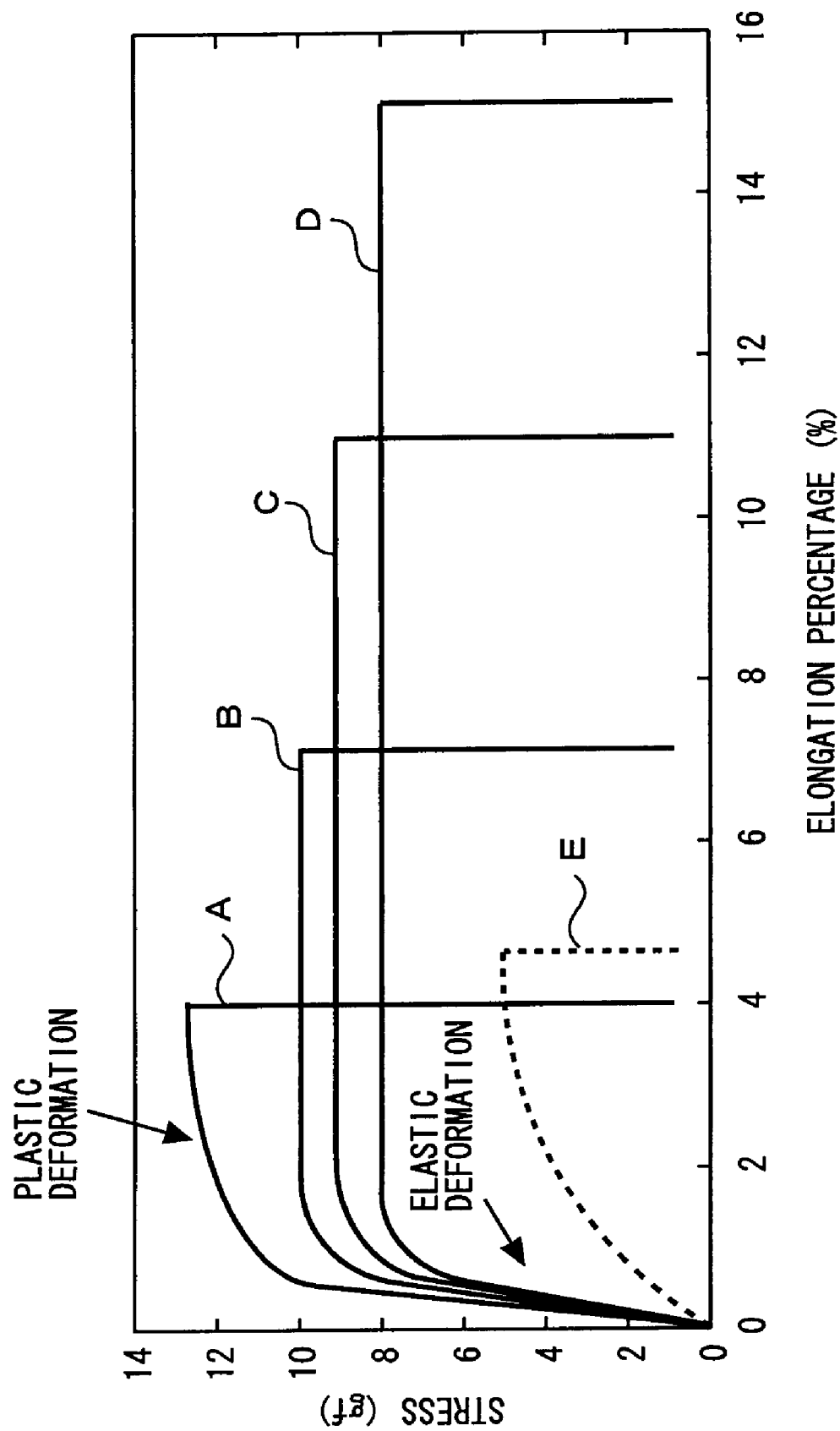
FIG. 4 is a drawing showing the relation between an elongation percentage of a gold wire, and the stress.

Here, in the present invention, in order to prevent electric short circuit of wires, and peeling of the bump electrode, a material of gold wire 13 is set up as follows. First, FIG. 4 is a drawing showing the relation of elongation percentage and stress of a gold wire. When tensile stress is applied in the length direction, gold wire A is cut when an elongation percentage becomes 4%, and the stress at that time (breaking strength) is 12.4 gf. Similarly, when an elongation percentage is 7% with gold wire B, breaking strength is 9.5 gf, when an elongation percentage is 11% with gold wire C, breaking strength is 8.8 gf, and with gold wire D, when an elongation percentage is 15%, breaking strength is 8.3 gf. And gold wire E is a soft type gold wire, and its breaking strength is low compared with hard type gold wire A-D.

When the stress is applied, at first, a gold wire will perform elastic deformation and will perform plastic deformation after that. The inclination in the case of this elastic deformation is equivalent to the modulus of elasticity of a gold wire. And the moduli of elasticity of hard type gold wire A-D are 9.4, 9.3, 9, and 8.5 (×103 kgf/mm2), respectively, and soft type gold wire E has a low modulus of elasticity compared with these.

In order to prevent the distortion (deformation) of a gold wire by the reaction at the time of cutting the gold wire, and the peeling from aluminum pad 11 of bump electrode 14, it is preferred to use a gold wire with low breaking strength. This is because the maximum load which will be applied by the time of fracture is small and the energy released as reaction at the time of fracture is small with a wire with low breaking strength. In order to prevent deformation of a gold wire, a gold wire with a high modulus of elasticity is preferred. This is because the wire with a high modulus of elasticity can more suppress the deformation at the time of energy being applied. Therefore, the one where the ratio of a modulus of elasticity to the breaking strength per unit area, i.e., (the modulus of elasticity (kgf/mm2)/breaking strength per unit area (kgf/mm2)) is higher is preferred. However, there is an inclination for the wire with a high modulus of elasticity to have high breaking strength like the above-mentioned gold wire A, and for the wire with low breaking strength to have a low modulus of elasticity like the above-mentioned gold wire E. Then, what fulfills the following condition as a gold wire is used.

(A modulus of elasticity (kgf/mm2)/breaking strength per unit area (kgf/mm2))≧400

Since a wire can be cut by low load by this, maintaining the modulus of elasticity of a wire, the electric short circuit of the wires accompanying deformation of a wire and the peeling of a bump electrode are prevented, so that the highly integrated semiconductor device can be stably manufactured. In particular, in material with as high elongation percentage of the wire at the time of fracture as at least 6% or more, more preferably 10% or more, it becomes easy to obtain the characteristics of the rate of high elasticity and low breaking strength like gold wire B, C, and D.

Figure 5A:
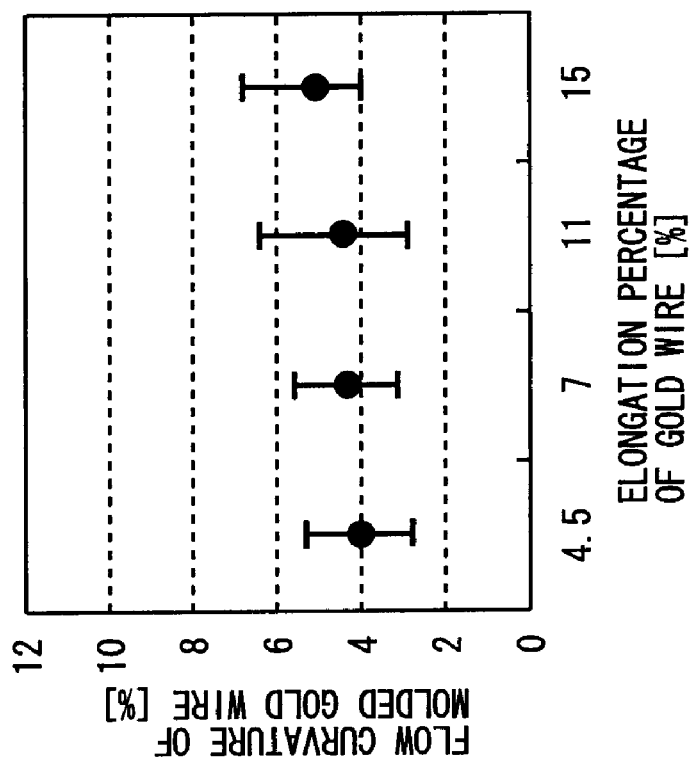
FIGS. 5A and 5B are drawings showing the elongation percentage of a gold wire, and the flow curvature of a gold wire.
Figure 5B:
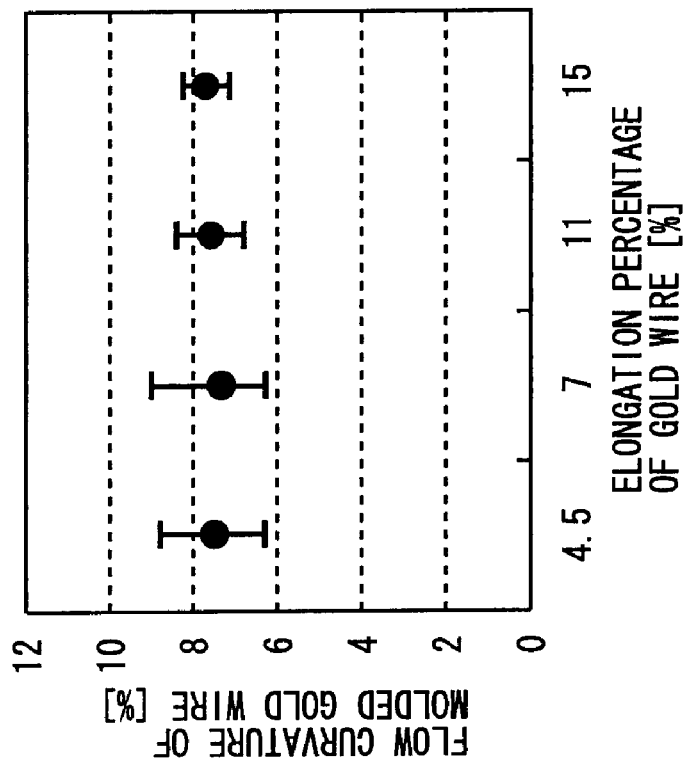

Further, in the present invention, in order to prevent gold wires from electrically short-circuiting with flowing when sealing resin is poured, the material of sealing resin is set up as follows. First, FIGS. 5A and 5B are the drawings showing the relation between the elongation percentage of a gold wire, and the flow curvature of a gold wire. The flow curvature of a gold wire is the curvature of the gold wire flowed, when sealing with sealing resin. FIG. 5A is a case where the resin whose spiral flow is less than 110 cm and whose viscosity is 10 Pa·S or more is used. FIG. 5B is a case where the resin whose spiral flow is 110 cm or more and whose viscosity is less than 10 Pa·S is used.

Here, the measurement of melt viscosity is based on JIS K7210, and as a measurement condition, the amount of a sample shall be 3 g, a temperature level shall be 175±2° C., and a nozzle dimension shall be (1.00±0.02) mmφ×10 mm. Spiral flow is a length which resin reaches, when resin is filled up under certain conditions into the flow test metal mold having a spiral shape. This spiral flow can estimate the fluidity of the resin in injection molding.

The metal mold specified to EMMI-1-66 and a transfer-molding machine are used for measurement of spiral flow as a measuring apparatus. Further, a test sample is measured after being taken out from a preservation warehouse, leaving as it is under a room temperature for 2 hours being unopened, and opening after that. And the test is completed within 2 hours after opening. Further, as measurement conditions, an amount of a sample is set as about 15 g, setting cull thickness as about 3 mm, injection pressure as 6.9±0.5 MPa, molding time as 120±5 seconds, preheating as off, and temperature level as 175±2° C. Under these conditions, a sample is inserted after checking having reached the prescribed temperature level, a plunger is dropped promptly, and application of pressure is started within 10 seconds. And a metal mold is disassembled after termination of a prescribed period, and spiral flow is measured by reading the flow length (cm) of resin.

Compared with FIG. 5A, the flow curvature of a gold wire is small in FIG. 5B. Therefore, in order to prevent gold wires from electrically short-circuiting with a gold wire's flowing when sealing resin is poured, it is preferred to use the resin whose spiral flow is 110 cm or more and whose viscosity is less than 10 Pa·S.

Figure 6A:
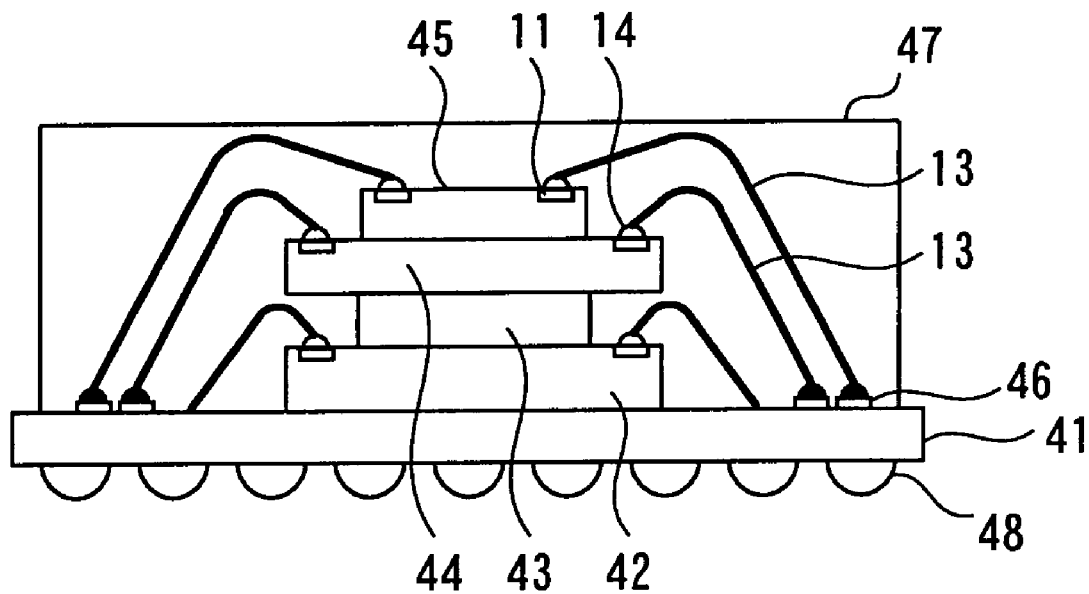
FIG. 6A is a sectional view showing another example of the semiconductor device concerning First Embodiment of the present invention.
Figure 6B:
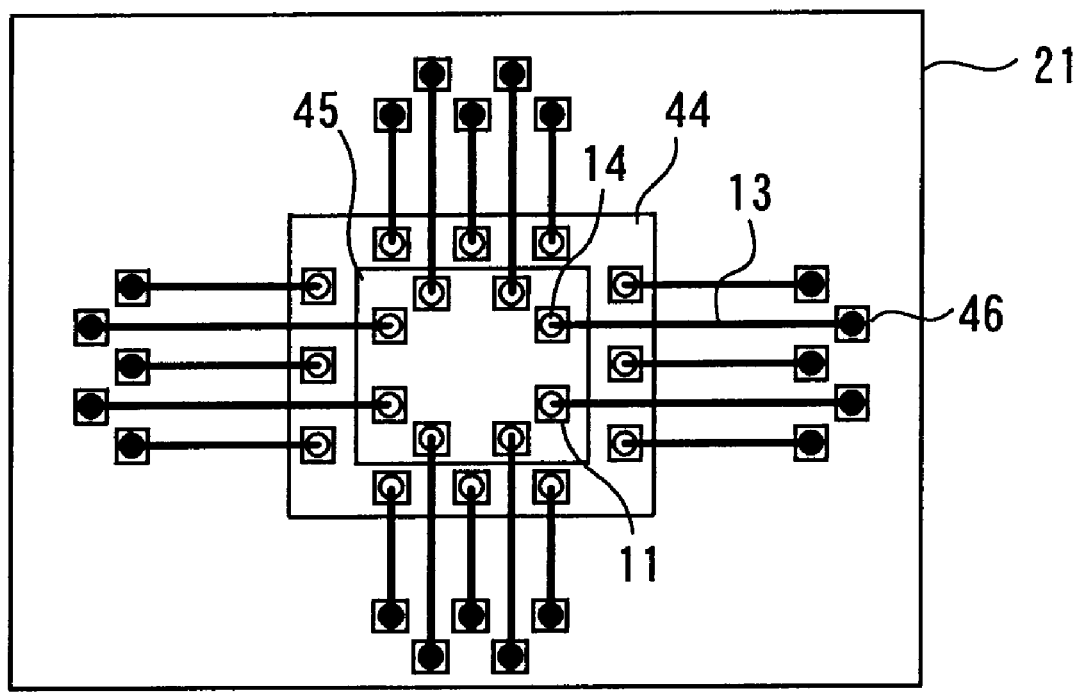
FIG. 6B is a top view showing another example of the semiconductor device concerning First Embodiment of the present invention.

FIG. 6A is a sectional view showing another example of the semiconductor device concerning First Embodiment of the present invention, and FIG. 6B is the top view. On glass epoxy wiring substrate 41, chip 42, spacer chip 43, chip 44, and chip 45 are mounted. Bump electrodes 14 are formed on aluminum pads 11 of chips 44 and 45. And ball bonding of gold wire 13 is performed on lead 46, and the stitch bonding is performed on bump electrode 14. The whole is sealed with sealing resin 47 and solder balls 48 are formed on the bottom face of glass epoxy wiring substrate 41.

Figure 7A:
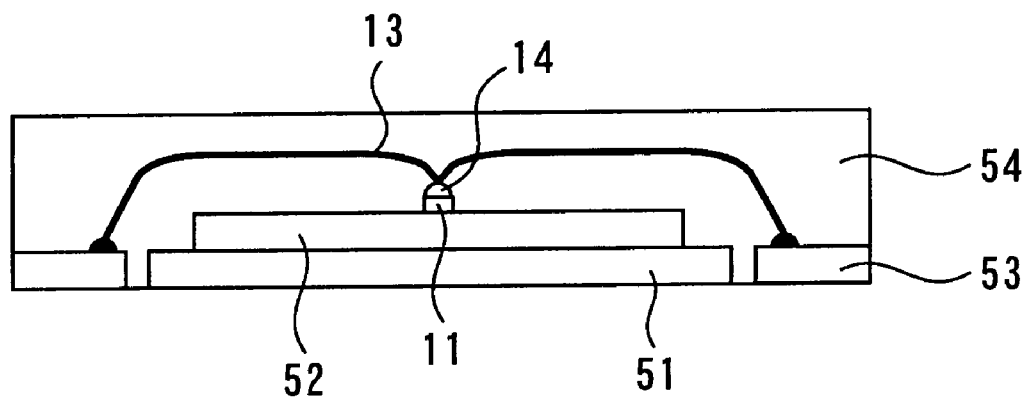
FIG. 7A is a sectional view showing still another example of the semiconductor device concerning First Embodiment of the present invention.
Figure 7B:
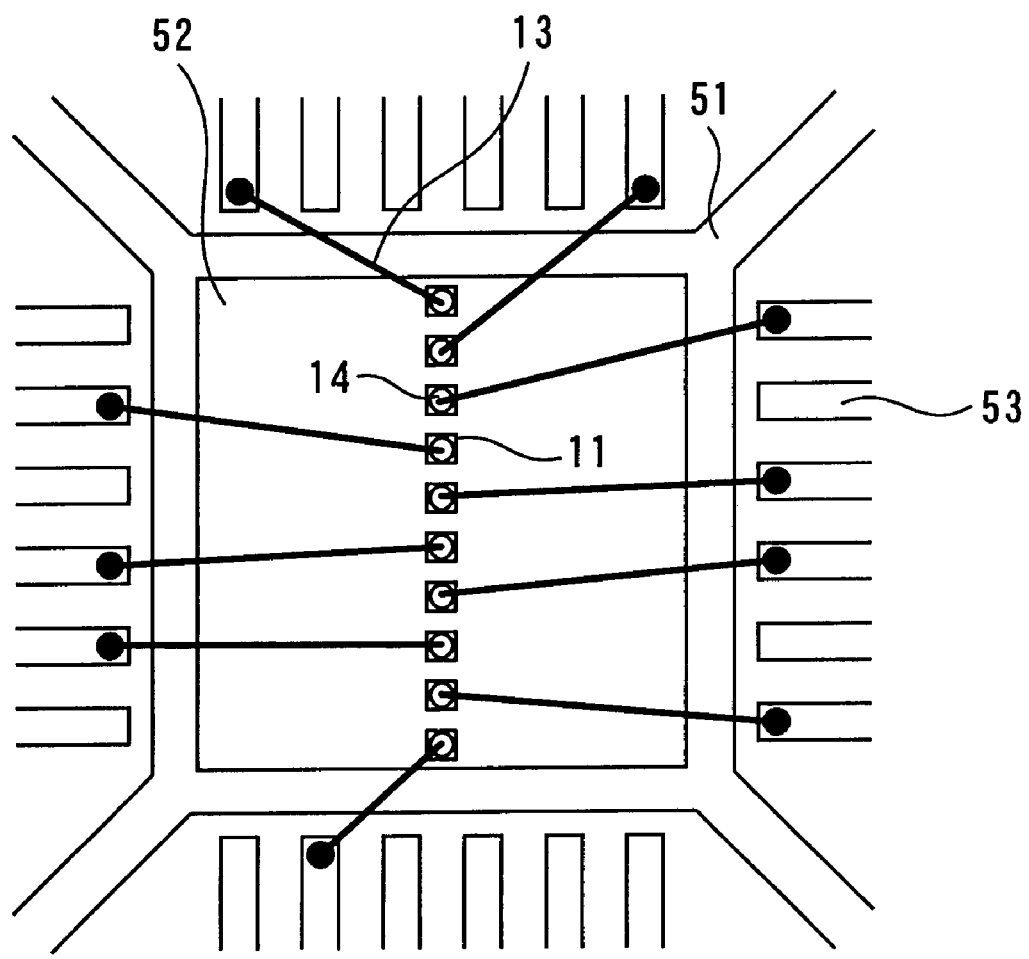
FIG. 7B is a top view showing still another example of the semiconductor device concerning First Embodiment of the present invention.

FIG. 7A is a sectional view showing still another example of the semiconductor device concerning First Embodiment of the present invention, and FIG. 7B is the top view. Chip 52 is mounted on die pad 51. And a plurality of aluminum pads 11 are formed at the center of chip 52 at one row. Bump electrode 14 is formed on this aluminum pad 11. And ball bonding of the gold wire 13 is performed on lead 53, and the stitch bonding is performed on bump electrode 14. Further, the whole is sealed with sealing resin 54.

Second Embodiment

Figure 8A:
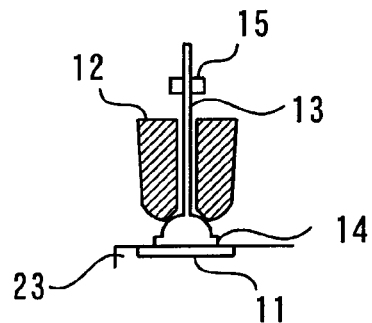
FIGS. 8A-8D are sectional views showing the manufacturing method of the semiconductor device concerning Second Embodiment of the present invention.

FIGS. 8A-8D are sectional views showing a manufacturing method of the semiconductor device concerning Second Embodiment of the present invention. First, as shown in FIG. 8A, bump electrode 14 is formed by joining the gold ball at the tip of gold wire 13 discharged from capillary 12 on aluminum pad 11 of chip 23, However, the thing of the material same as gold wire 13 as First Embodiment is used.

Figure 8B:
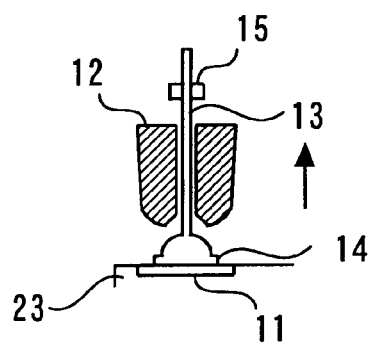

And as shown in FIG. 8B, capillary 12 is raised by 15 μm. Here, since the height of bump electrode 14 is 15 μm, capillary 12 is evacuated above bump electrode 14. In the dimension of capillary 12 and gold wire 13 which are used in the embodiment, the inside diameter of capillary 12 is 30 μm, and the diameter of gold wire 13 is 23 μm.

Figure 8C:
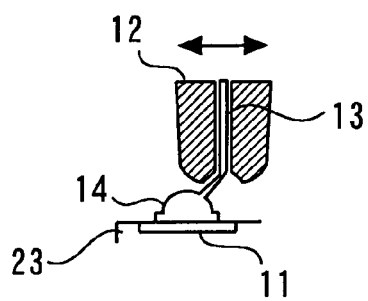

Capillary 12 is made to reciprocate in a horizontal direction after that, as shown in FIG. 8C. However, the operational amplitude of capillary 12 is more than the clearance between gold wire 13, and the inner wall of capillary 12 at least. Since the diameter of gold wire 13 is 23 μm and the inside diameter of capillary 12 is 30 μm concretely, the clearance between both is 3.5 μm at one side, when it is averaged, and when both sides are put together, it is 7 μm. It is necessary to be more than 3.5 μm which is the one side clearance between capillary 12 inner wall and gold wire 13 at worst as an amplitude of operation. In order to give sufficient stress to the tail cut portion of gold wire 13 and to reduce cut strength, it is more preferred to be as an amplitude of operation more than 7 μm which is the sum of the both sides of clearance between capillary 12 inner wall and gold wire 13. Then, for example, after performing 30 μm horizontal displacement of the capillary 12 to one way, a counter direction is made to perform 65 μm horizontal displacement. Hereby, stress can be given to tail cut portion of gold wire 13, and cut strength can be reduced. It is also possible to cut gold wire 13 from bump electrode 14 by horizontal displacement depending on the size of horizontal displacement.

Figure 8D:
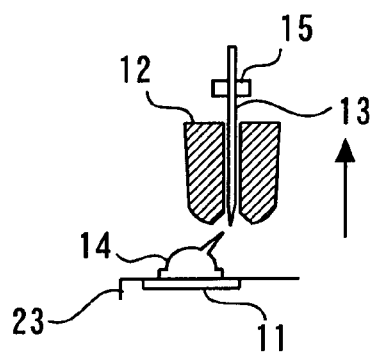

After that, as shown in FIG. 8D, gold wire 13 is cut by pulling upward, holding both sides of gold wire 13 by clamper 15. On this occasion, since the strength of gold wire 13 is decreasing with the reciprocating motion of capillary 12, reaction of a cut of gold wire 13 can be reduced and S character deflection of gold wire 13 and peeling of bump electrode 14 can be further suppressed rather than First Embodiment.

Bump electrode 14 contacting capillary 12 and bump electrode 14 receiving a damage can be prevented in the case of a reciprocating motion, by evacuating capillary 12 above bump electrode 14 before the reciprocating motion of capillary 12.

The circular motion may be performed to a horizontal direction, instead of making capillary 12 reciprocate to a horizontal direction. In addition, what is necessary is just the action comprising movement in a horizontal direction, when decomposing into vectors. Although limited for neither the frequency of an oscillation, nor an operation means in particular, since the amplitude of supersonic vibration is generally less than 1 μm, it is difficult to obtain amplitude sufficient as an action of capillary 12 for reducing the strength of gold wire 13. In this embodiment, the horizontal displacement action of the above-mentioned capillary 12 was generated by making it operate, performing position control of the motor mechanically as the source of power.

Third Embodiment

Figure 9A:
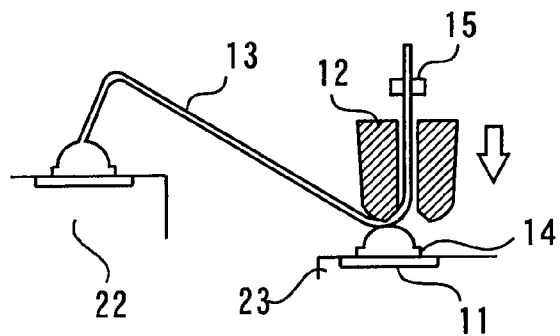
FIGS. 9A-9D are sectional views showing the manufacturing method of the semiconductor device concerning Third Embodiment of the present invention.

FIGS. 9A-9D are sectional views showing a manufacturing method of a semiconductor device concerning Third Embodiment of the present invention. First, as shown in FIG. 9A, after performing ball bonding of the gold ball at gold wire 13 tip on the aluminum pad of chip 22 using capillary 12, stitch bonding of the gold wire 13 is performed on bump electrode 14 formed on aluminum pad 11 of chip 23. Concretely speaking, gold wire 13 is crushed pushing and pressing gold wire 13 for 10 ms to bump electrode 14 by capillary 12, and applying supersonic vibration, and gold wire 13 is joined to bump electrode 14. However, as gold wire 13, the thing of the same material as First Embodiment is used.

Figure 9B:
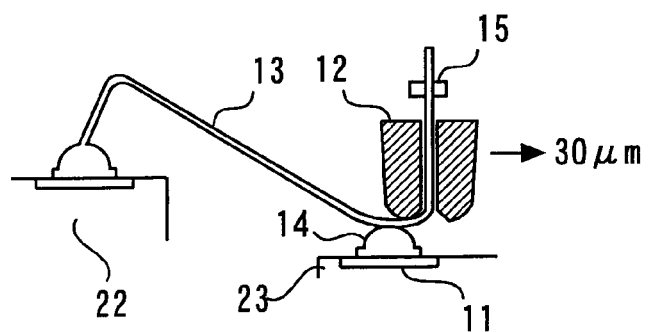

After that, as shown in FIG. 9B, capillary 12 is evacuated more than half of the amplitude of the horizontal direction action of capillary 12 of later process in the loop advancement direction of gold wire 13. For example, horizontal displacement of the capillary 12 is performed by 30 μm.

Figure 9C:
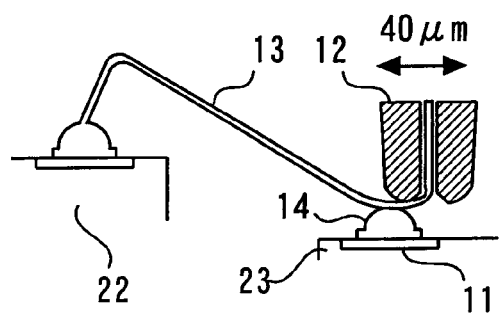

Capillary 12 is made to reciprocate in a horizontal direction like Second Embodiment after that, as shown in FIG. 9C. However, the amplitude of capillary 12 of operation is made at least to more than the clearance between gold wire 13, and the inner wall of capillary 12. That is, it is necessary to be more than 3.5 μm which is a one side clearance between capillary 12 inner wall and gold wire 13 at worst as an amplitude of operation. Further, in order to give sufficient stress to tail cut portion of gold wire 13 and to reduce cut strength, it is more preferred to be as amplitude of operation more than 7 μm which is the sum of both sides of the clearance between capillary 12 inner wall and gold wire 13. The amplitude of operation in this embodiment is 40 μm.

Figure 9D:
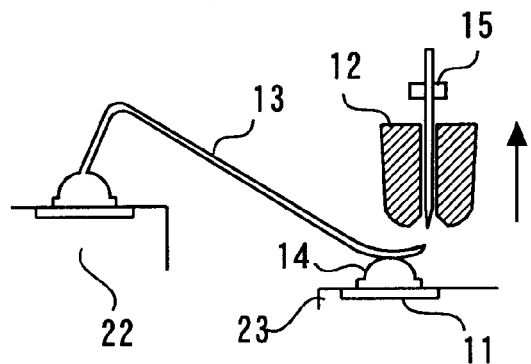
Figure 10A:
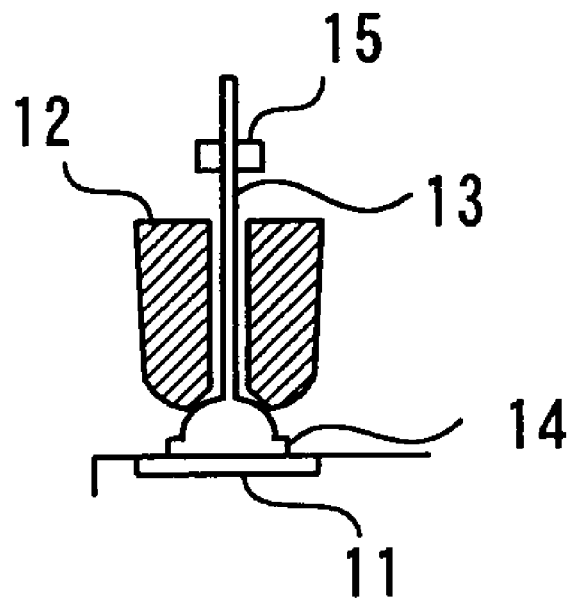
FIGS. 10A and 10B are sectional views showing the state of conventional bump electrode formation.
Figure 10B:
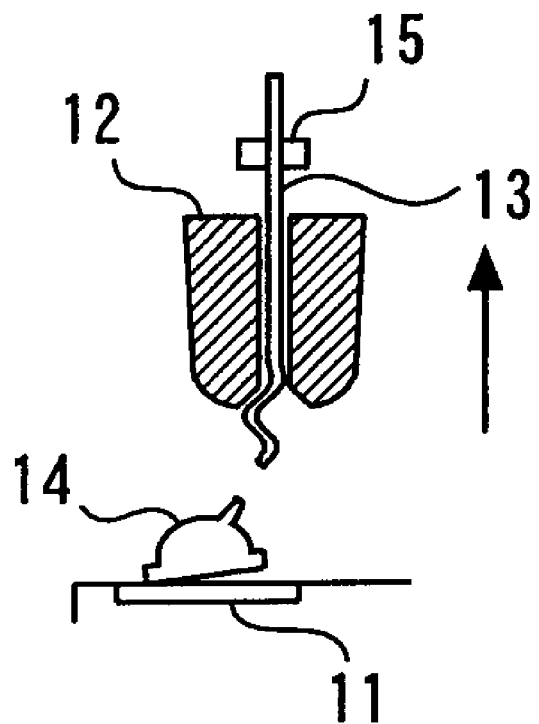
Figure 11A:
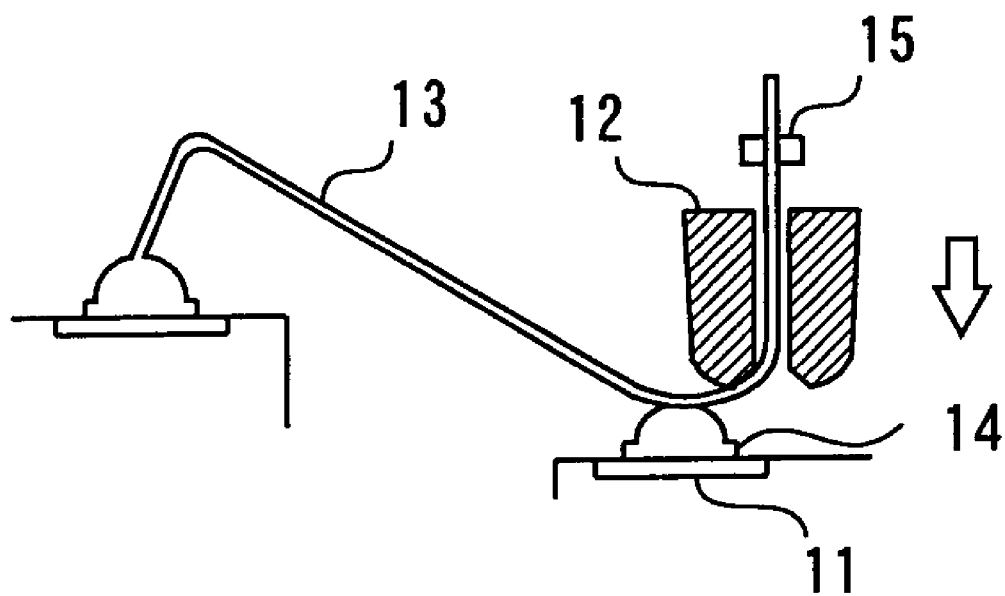
FIGS. 11A and 11B are sectional views showing the state of conventional stitch bonding of a wire onto a bump electrode.
Figure 11B:
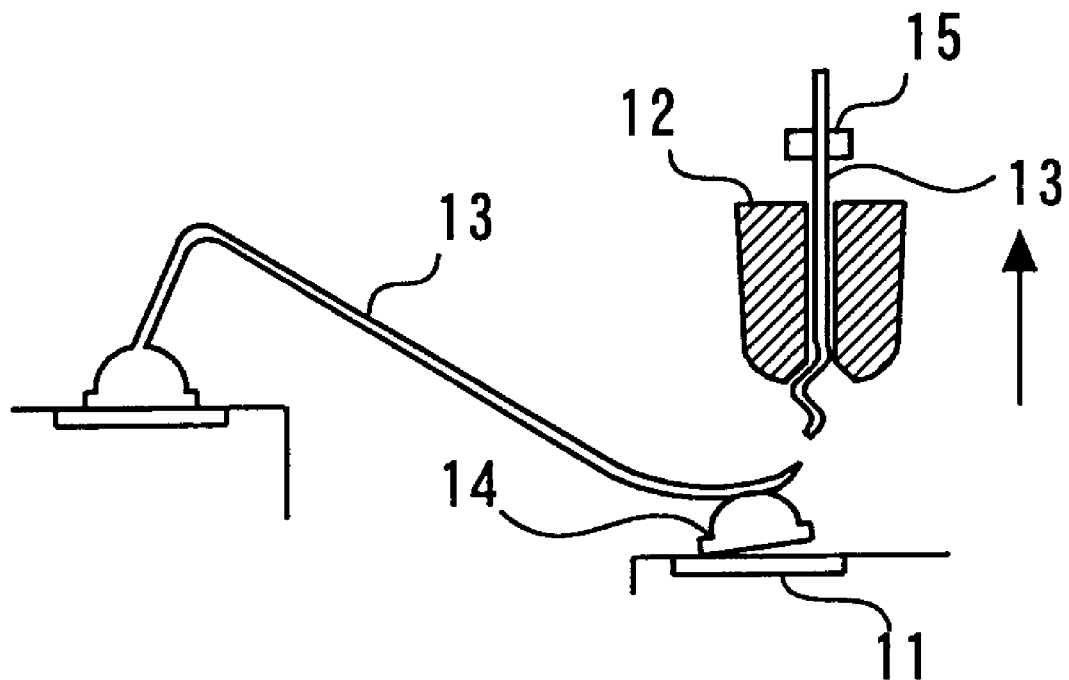

After that, as shown in FIG. 9D, gold wire 13 is cut by pulling upward, holding both sides of gold wire 13 by clamper 15. On this occasion, since the cut strength of gold wire 13 is reduced with the reciprocating motion of capillary 12, reaction of a cut of gold wire 13 can be reduced. S character deflection of gold wire 13 and peeling of bump electrode 14 can be further suppressed rather than First Embodiment. It is also possible to cut gold wire 13 with a reciprocating motion depending on the amplitude of a reciprocating motion of operation. In this case, S character deflection of a wire by reaction of a cut of gold wire 13 can be suppressed to the minimum.

Since capillary 12 is separated from the location which started stitch bonding, i.e., the location where gold wire 13 is contacting bump electrode 14 by more than half of the amplitude of a both-way action before the reciprocating motion of capillary 12, in the reciprocating motion of capillary 12, giving of the stress to joining portion of gold wire 13 and bump electrode 14, and the portion of the root of gold wire 13 can be reduced, and sharp strength lowering and an open circuit of a gold wire can be prevented.

Obviously many modifications and variations of the present invention are possible in the light of the above teachings. It is therefore to be understood that within the scope of the appended claims the invention may be practiced otherwise than as specifically described.

What is claimed is:

1. A semiconductor device, comprising:
a chip which has a pad;
a bump electrode formed over the pad; and
a wire whose stitch bonding is made over the bump electrode;
wherein the wire satisfies a condition:

(modulus-of-elasticity/breaking strength per unit area) $\geq 400$.

2. A semiconductor device according to claim 1, further comprising:
sealing resin which seals the chip, the bump electrode, and the wire; wherein as for the sealing resin, spiral flow is 110 cm or more, and viscosity is less than 10 Pa·S.

* * * * *